(12) United States Patent
Shigaki et al.

(10) Patent No.: US 12,225,668 B2
(45) Date of Patent: Feb. 11, 2025

(54) PRODUCTION DATA CREATION DEVICE AND PRODUCTION DATA CREATION METHOD

(71) Applicant: Panasonic Intellectual Property Management Co., Ltd., Osaka (JP)

(72) Inventors: Eiji Shigaki, Fukuoka (JP); Taichi Shimizu, Osaka (JP); Takaaki Yokoi, Fukuoka (JP); Takuya Yamazaki, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 416 days.

(21) Appl. No.: 17/441,242

(22) PCT Filed: Jan. 6, 2020

(86) PCT No.: PCT/JP2020/000080
§ 371 (c)(1),
(2) Date: Sep. 20, 2021

(87) PCT Pub. No.: WO2020/194979
PCT Pub. Date: Oct. 1, 2020

(65) Prior Publication Data
US 2022/0174851 A1    Jun. 2, 2022

(30) Foreign Application Priority Data
Mar. 28, 2019 (JP) .................................. 2019-062145

(51) Int. Cl.
G05B 19/418 (2006.01)
G06F 3/0484 (2022.01)
(Continued)

(52) U.S. Cl.
CPC ... *H05K 13/0882* (2018.08); *G05B 19/41865* (2013.01); *G06F 3/0484* (2013.01); *H05K 13/0409* (2018.08); *G05B 2219/31103* (2013.01)

(58) Field of Classification Search
None
See application file for complete search history.

(56) References Cited

U.S. PATENT DOCUMENTS

2004/0029299 A1* 2/2004 Pasadyn ................. H01L 22/20
700/121
2008/0289175 A1* 11/2008 Inoue .................... H05K 3/3485
29/840

(Continued)

FOREIGN PATENT DOCUMENTS

EP        2480061      7/2012
JP      2009-105217    5/2009

(Continued)

OTHER PUBLICATIONS

Barajas et al., "Stencil Printing Process Modeling and Control Using Statistical Neural Networks", Jan. 2008, IEEE transactions on electronics packaging manufacturing, vol. 31, No. 1, pp. 9-17 (Year: 2008).*

(Continued)

*Primary Examiner* — Jason Lin
(74) *Attorney, Agent, or Firm* — MCDONALD HOPKINS LLC

(57) ABSTRACT

A production data creation device includes an input unit and a setting unit. The input unit receives an input of one application from among a plurality of applications displayed on a screen. The setting unit sets one or more operation parameters used by a component mounter to mount a component on a board, on the basis of the input application.

18 Claims, 9 Drawing Sheets

(51) Int. Cl.
  *H05K 13/04*    (2006.01)
  *H05K 13/08*    (2006.01)

(56)  References Cited

U.S. PATENT DOCUMENTS

2009/0082881 A1*  3/2009  Awata ................... H05K 13/08
                                                    700/80
2015/0289426 A1* 10/2015  Mantani ............ H05K 13/0015
                                                    228/9
2017/0049013 A1*  2/2017  Kanai ................ H05K 13/0812
2017/0064883 A1*  3/2017  Kawai ............... H05K 13/0408
2017/0308049 A1* 10/2017  Fujii ................ G05B 19/41875
2017/0311493 A1* 10/2017  Ito ........................ H05K 13/041
2018/0098466 A1*  4/2018  Eguchi .............. H05K 13/0815
2018/0153061 A1*  5/2018  Iisaka ....................... G06T 7/60
2018/0314918 A1* 11/2018  Amano ................. H05K 13/04
2018/0364687 A1* 12/2018  Tan ..................... H05K 13/083

FOREIGN PATENT DOCUMENTS

| JP | 2012-156200    |   | 8/2012 |
| JP | 2019-004129    |   | 1/2019 |
| KR | 20140023536 A  | * | 2/2014 |
| WO | 2016/017276    |   | 2/2016 |

OTHER PUBLICATIONS

International Search Report of PCT application No. PCT/JP2020/000080 dated Mar. 24, 2020.

\* cited by examiner

PRODUCTION DATA CREATION DEVICE AND PRODUCTION DATA CREATION METHOD

TECHNICAL FIELD

The present disclosure relates to a production data creation device and production data creation method for creating production data used by a component mounter to mount components on a board.

BACKGROUND ART

Component mounting operations of a component mounter to mount components on a board are controlled on the basis of operation parameters including a large number of parameters, such as parameters regarding suction of the components achieved by nozzles, parameters regarding recognition of shapes of the components, and parameters regarding attachment of the components to the board. As the operation parameters, it is necessary to set appropriate values for each component. PTL 1 describes calculation of parameters, such as an appropriate operation acceleration of a head, based on a ratio of an input mass of a component and an area of a suction hole of a nozzle to suck the component.

CITATION LIST

Patent Literature

PTL 1: Japanese Patent Unexamined Publication No. 2012-156200

SUMMARY OF THE INVENTION

A production data creation device according to the present disclosure includes an input unit and a setting unit.

The input unit receives an input of one application from among a plurality of applications displayed on a screen.

The setting unit sets one or more operation parameters used by a component mounter to mount a component on a board, on the basis of the input application.

A production data creation method according to the present disclosure includes: receiving an input of one application from among a plurality of applications displayed on a screen; and setting one or more operation parameters used by a component mounter to mount a component on a board, on the basis of the input application.

A production data creation device according to another aspect of the present disclosure includes an input unit and a setting unit.

The input unit receives at least inputs of one or more input parameters based on quality and productivity.

The setting unit sets one or more operation parameters used by a component mounter to mount a component on a board, on the basis of the one or more input parameters that have been input.

A production data creation method according to another aspect of the present disclosure includes: receiving at least inputs of one or more input parameters based on quality and productivity; and setting one or more operation parameters used by a component mounter to mount a component on a board, on the basis of the one or more input parameters that have been input.

DESCRIPTION OF EMBODIMENT

Even in a case in which the same components are mounted, optimal component mounting operations are different depending on which of an in-vehicle device board with a priority placed on quality and a communication device board with a priority placed on productivity a model to be produced is. Therefore, it is desirable to prepare optimal operation parameters in accordance with applications of a board. However, according to the related art including PTL 1, it is not possible to automatically generate operation parameters in consideration of applications of a board, operators are to change operation parameters on experiential grounds on the basis of a set of operation parameters calculated for each component, and there are variations in how satisfactorily the operation parameters are created depending on the operators who create the operation parameters.

An exemplary embodiment of the present disclosure will be described with reference to drawings. First, referring to FIG. 1, a configuration of component mounting system 1 will be described. Component mounting system 1 has a function of mounting a component on a board to produce a mounting board. The present exemplary embodiment is configured such that a plurality of (three in this case) component mounting lines 4 are connected to management computer 3 via communication network 2. Tasks in component mounting lines 4 are managed by management computer 3. The number of component mounting lines 4 is not limited to three and may be one, two, five, or more.

Management computer 3 has a function of transmitting data necessary to run production facilities (component mounters M4 and M5) included in component mounting lines 4 to the production facilities. Also, data such as running statuses and task histories of the production facilities is transmitted from the production facilities to management computer 3. Component mounting system 1 may include a computer for line management for each of component mounting lines 4, and management computer 3 and the production facilities may transmit and receive data to and from each other via the computer for line management. In addition, management computer 3 has a function of creating operation parameters, component data, production data, and the like used by the production facilities on component mounting lines 4.

Figure 1:
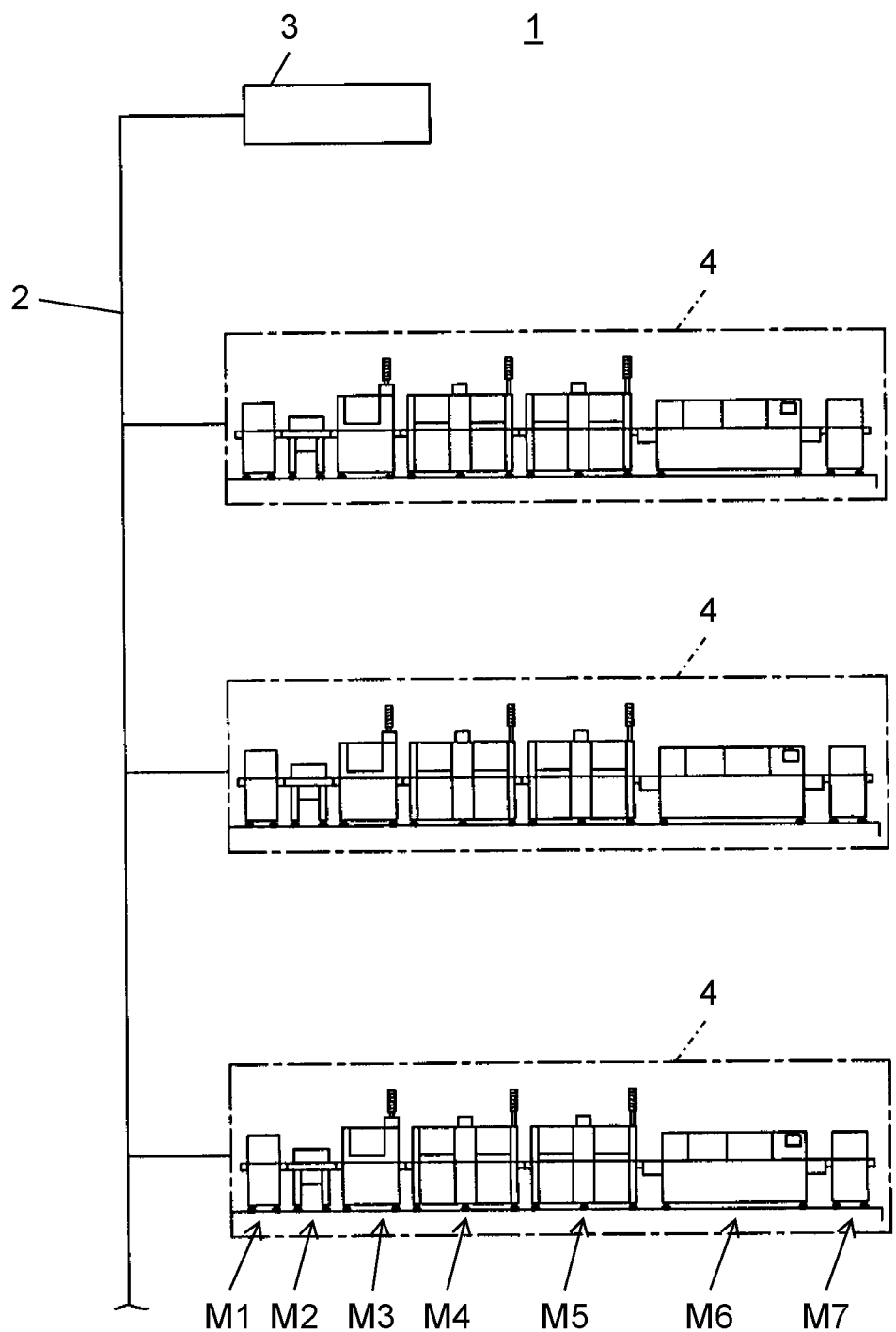
FIG. 1 is a configuration explanatory diagram of a component mounting system according to an exemplary embodiment.

In FIG. 1, each component mounting line 4 is configured such that board supply device M1, board passing device M2, solder printing device M3, component mounters M4 and M5, reflow device M6, and board collection device M7 are coupled. A board supplied by board supply device M1 is transported to solder printing device M3 via board passing device M2. Solder printing device M3 performs a solder printing task of performing, on the board, screen-printing with a solder for bonding a component thereto.

The board after the solder printing is sequentially passed to component mounters M4 and M5. Component mounters M4 and M5 execute a component mounting task of mounting a component on the board after the solder printing. Component mounters M4 and M5 extracts a component supplied by a feeder through vacuum suction using a nozzle included in a mounting head, image a state of the component held by the nozzle using a component recognition camera, and mounts the component at a mounting position on the board at a designated mounting angle. Component mounters M4 and M5 include a plurality of sensors to monitor task mistakes, operation errors, and the like in component mounting tasks such as a suction operation of the nozzle sucking the component and component recognition of a component recognition camera imaging and recognizing the extracted component.

The board after the component mounted thereon is transported to reflow device M6. Reflow device M6 heats the board in accordance with a predetermined heating profile to melt and solidify the solder for bonding the component. The component is thus solder-bonded to the board, and the mounting board in which the component is mounted on the board is completed and is then collected by board collection device M7.

Next, referring to FIG. 2, a configuration of a processing system of management computer 3 will be described. Here, a configuration regarding a function of creating operation parameters, component data, and production data used by component mounters M4 and M5 to perform the component mounting task from among a plurality of functions that management computer 3 has will be described. Management computer 3 includes processing unit 10, production information storage unit 15 which is a storage device, production history storage unit 21, input unit 23, display unit 24, and communication unit 25.

Processing unit 10 is a data processing device such as a central processing unit (CPU) and includes, as internal processing units, input processing unit 11, first setting unit 12, second setting unit 13, and achievement acquisition unit 14. Management computer 3 is not necessarily configured with one computer and may be configured with a plurality of devices. For example, all or some of the storage devices and the processing units may be included on a cloud via a server. Moreover, it is not necessary for processing unit 10 to include both first setting unit 12 and second setting unit 13, and processing unit 10 may include any one of the first setting unit and second setting unit 13.

Input unit 23 is an input device such as a keyboard, a touch panel, or a mouse and is used to input an operation command, data, and the like. Display unit 24 is a display device such as a liquid crystal panel, displays various kinds of data stored in the storage unit, and also displays various kinds of information such as an operation screen, an input screen, and the like for operations through input unit 23. Communication unit 25 is a communication interface and transmits and receives data to and from the production facilities (component mounters M4 and M5) configuring component mounting lines 4 via communication network 2.

Figure 2:
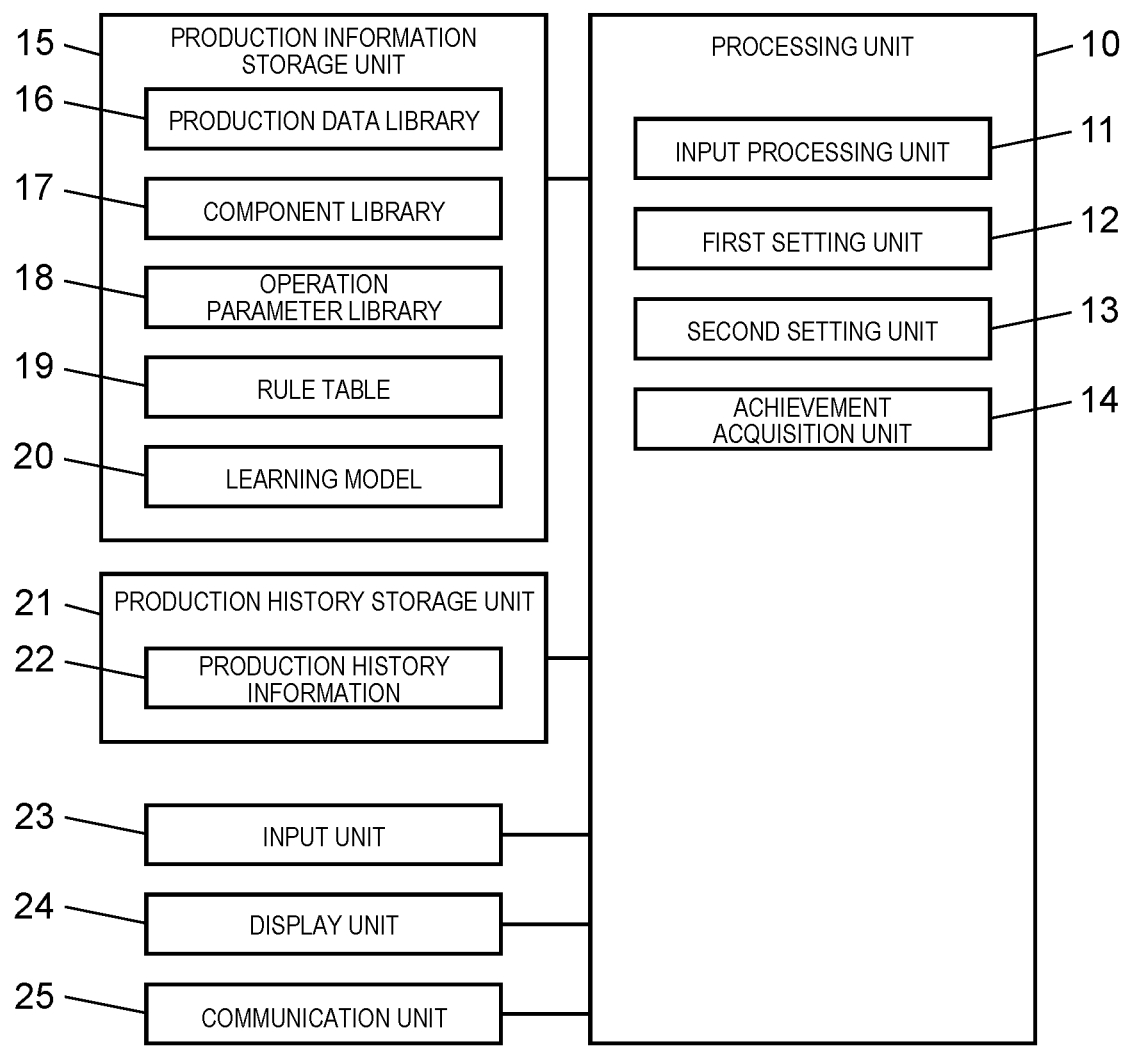
FIG. 2 is a block diagram illustrating a configuration of a processing system of a management computer (production data creation device) according to the exemplary embodiment.

In FIG. 2, production information storage unit 15 stores production data library 16, component library 17, operation parameter library 18, rule table 19, learning model 20, and the like. Production data library 16 stores, for each production model name of the mounting board, production data used by component mounters M4 and M5 to produce the mounting board.

Figure 3:
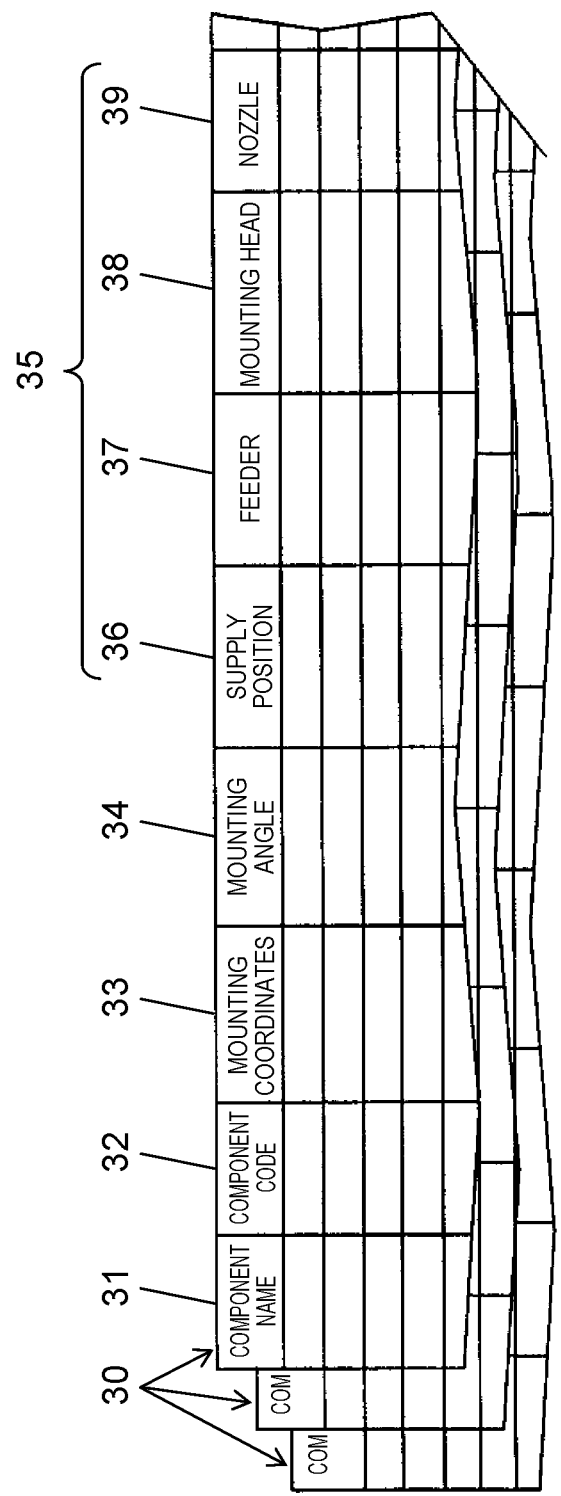
FIG. 3 is a configuration explanatory diagram of production data used in the component mounting system according to the exemplary embodiment.

Here, an example of production data 30 included in production data library 16 will be described with reference to FIG. 3. Each of a plurality of items of production data 30 included in production data library 16 defines data necessary to produce the mounting board with one production model name. In other words, production data 30 defines "component name" 31 of the component to be mounted on the mounting board of the production model name, component code 32 for associating the component with component data in component library 17, and "mounting coordinates" 33 and "mounting angle" 34 indicating a mounting position and a mounting angle, respectively, of the component on the mounting board, for each component that is a mounting target.

Further, production data 30 defines, for each component name, conditions on the side of the facilities used to produce the mounting board, that is, facility condition data 35 indicating setting states of component mounters M4 and M5. The example described here is configured such that facility condition data 35 is included in production data 30 provided via communication network 2. However, a form in which only facility condition data 35 is provided in another file may also be employed.

As facility condition data 35, the following data regarding component mounters M4 and M5 is defined. Specifically, "supply position" 36 indicating the position to which the component is to be supplied, "feeder" 37 indicating a feeder to be used to supply the component, "mounting head" 38 indicating a mounting head to perform the component mounting task of mounting the component, "nozzle" 39 indicating a nozzle to be used to hold the component, and the like are defined.

In FIG. 2, component library 17 stores a plurality of items of component data in which types of components and operation parameters for precisely controlling various tasks of component mounters M4 and M5 mounting the components are associated with each other. The component data is associated with production data 30 with component code 32. In other words, different component data corresponding to the mounting position for the production model name of the mounting board to be produced is stored in component library 17 even for a component with the same component name. In a case in which operation parameters are the same regardless of different production model names and different mounting positions, common component data is used.

Figure 4:
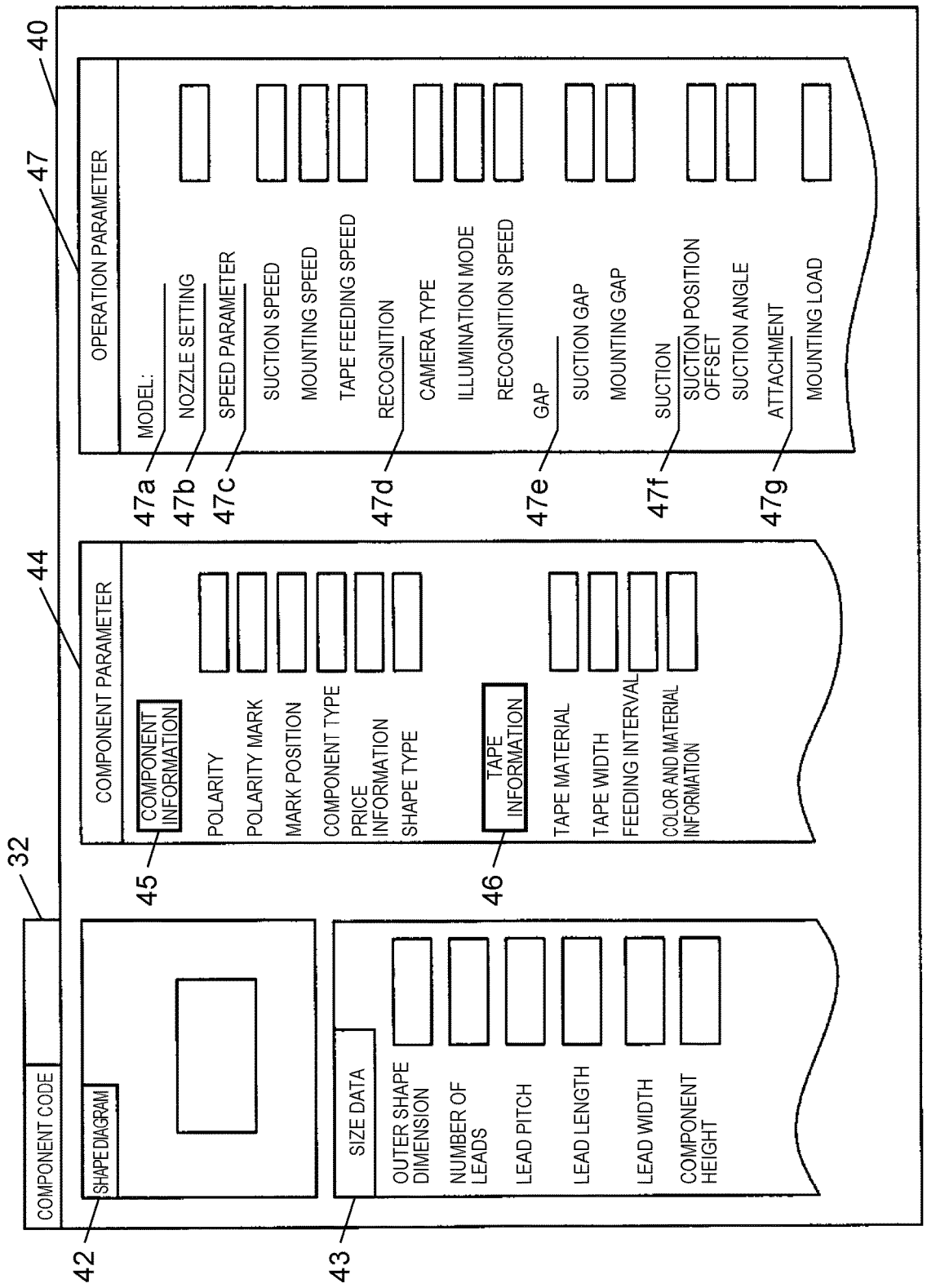
FIG. 4 is a configuration explanatory diagram of component data used in the component mounting system according to the exemplary embodiment.

Here, referring to FIG. 4, an example of component data 40 included in component library 17 will be described. Component data 40 is associated with production data 30 with component code 32.

Component data 40 is configured with shape diagram 42, size data 43, component parameters 44, and operation parameters 47. An image, a numerical value, a term, or the like is input to a blank portion of each item. The "numerical value" used herein is not limited to numerical value data and includes a result of selecting an option and the like that is quantitatively/qualitatively presented, such as presence/absence, inexpensive/expensive, and high speed/medium speed/low speed. Shape diagram 42 illustrates an outer shape of the target component. Size data 43 indicates, as numerical value data, size information of the component, that is, an outer shape dimension, the number of leads, a lead pitch, a lead length, a lead width, and a component height.

Component parameters 44 are attribute information for the component and include component information 45 which is information regarding the component itself and tape information 46 which is information regarding a carrier tape for supplying the component using a feeder. Component information 45 indicates a polarity of the component, a polarity mark, a mark position, a component type, a shape type, and price information. Tape information 46 includes color and material information which is information related to a tape material of the carrier tape, a tape width indicating the width dimension of the carrier tape, feeding interval indicating a tape feeding pitch, and properties when the carrier tape is defined as a target of image recognition.

Operation parameters 47 are machine parameters defining an operation form when the component is defined as a target of the component mounting task performed by component mounters M4 and M5. In the example described here, model 47a indicating the type of component mounters M4 and M5 and nozzle setting 47b indicating the type of the nozzle to be used are included. Moreover, operation parameters 47 include speed parameter 47c, recognition 47d, gap 47e, suction 47f, attachment 47g, and the like.

Speed parameter 47c includes a suction speed when the nozzle sucks the component, a mounting speed when the mounting head transfers the component, a tape feeding speed when the feeder feeds the carrier tape. In the present exemplary embodiment, proportions of the suction speed, the mounting speed, and the tape feeding speed with respect to the maximum speed can be set within a range of 100% to 20%. Recognition 47d is a parameter defining a form of component recognition and includes a camera type indicating the type of the component recognition camera to be used, an illumination mode indicating an illumination form at the time of imaging, and a recognition speed which is a nozzle moving speed at the time of imaging. The recognition speed can be set from a high speed, a medium speed, and a low speed. The parameter regarding the speed may be a numerical value (1 to 100%) or may be an option (a high speed, a medium speed, a low speed, or the like).

Gap 47e includes a suction gap when the nozzle sucks the component and a mounting gap when the held component is mounted on the board. Suction 47f defines a suction position offset indicating the amount of offset when the nozzle sucks the component and a suction angle. Attachment 47g defines a pressing load when the component held by the nozzle is attached to the board.

In this manner, operation parameters 47 include the nozzle parameters (nozzle setting 47b) regarding the nozzle that sucks the component, the suction parameters (the suction speed, the suction gap, and suction 47f) regarding the suction for the nozzle to perform the suction, the recognition parameters (recognition 47d) for recognizing the shape of the component, the mounting parameters (the mounting speed, the mounting gap, and attachment 47g (for mounting the component, and the like. Component parameters 44 and operation parameters 47 indicated by component data 40 in FIG. 4 are examples of the corresponding items, and various parameters other than the items described here are set as needed.

Examples of the parameters include a suction holding time that is a time during which the nozzle comes into contact with the component at the time of the suction of the component, a mounting holding time that is a time during which the component is brought into contact with the board when the component is attached to the board, the number of times of the component recognition that is the number of times the recognition camera recognizes the component, suction check ON/OFF indicating whether to check if the component has been sucked, a thickness variation allowable value for setting an allowable value when the component thickness is measured, component suction state detection ON/OFF indicating whether to detect a suction state of the component, component simultaneous suction/mounting ON/OFF indicating whether to simultaneously suck or mount the component, component suction position automatic learning ON/OFF indicating whether to automatically set an suction position of the component, the number of times of component suction retry indicating the number of times suction is repeated when suction of the component is failed, and the number of times of recognition retry indicating the number of times recognition is repeated in a case in which the component cannot be recognized.

In FIG. 2, operation parameter library 18 stores a plurality of operation parameter sets that are groups of a plurality of parameters set as operation parameters 47 of component data 40. Each operation parameter set stores, in advance, a recommended parameter set that can be used for general purposes without depending on the type of the component and the production model of the mounting board and a plurality of operation parameter sets corresponding to the application and the like of the mounting board. As the application of the mounting board, an in-vehicle device board with a priority placed on quality, a home appliance board with balanced quality and productivity, a communication device board with a priority placed on productivity, an electronic device board with a priority placed on a cost, a prototype board for the purpose of checking operations, or the like is set.

Production history storage unit 21 stores production history information 22 and the like. Production history information 22 stores achievement values acquired by achievement acquisition unit 14 such as task histories of component mounters M4 and M5 (production facilities), a suction rate indicating a success rate of the suction operation of the nozzle extracting the component from the feeder, a recognition rate indicating a success rate of the component recognition of imaging and recognizing the extracted component using the component recognition camera, and a defect rate indicating a proportion of components discarded due to task mistakes, operation errors, and the like from among the supplied components.

In FIG. 2, input processing unit 11 causes display unit 24 to display various input screens for allowing various kinds of information to set operation parameters 47 to be input through input unit 23. Here, referring to FIG. 5, application selection screen 50 that input processing unit 11 causes display unit 24 to display will be described. On application selection screen 50, "component name" input frame 51, "application" selection frame 52, and "enter" button 53 are displayed. A component name ("M8064") is input to "component name" input frame 51 through input unit 23. "In-vehicle device board", "home appliance board", "communication device board", "electronic device board", and "prototype board" are displayed in "application" selection frame 52 as options of the applications of the mounting board to be produced, and an application is selected through a selection of displayed radio button 52a through input unit 23.

Here, "home appliance board" has been selected. If "enter" button 53 is operated, then the production model name and the selected application input to application selection screen 50 are input. In this manner, input unit 23 receives an input of one application from among the plurality of applications displayed on the screen as options. The plurality of applications include the in-vehicle device board, the home appliance board, the communication device board, the electronic device board, and the prototype board. The applications are not limited to the terms such as the in-vehicle device board, the home appliance board, the communication device board, the electronic device board, and the prototype board as long as the terms are for specifying the plurality of applications, and other terms, signs, illustrations, or the like may also be used.

Next, referring to FIG. 6, component shape input screen 54 that input processing unit 11 causes display unit 24 to display will be described. Component shape input screen 54 is screen display to which size data 43 of component data 40 is to be input. On component shape input screen 54, "component name" input frame 55, "component shape" input frame 56, and "enter" button 57 are displayed. A name ("M8064") of a component to be mounted on the mounting board is input to "component name" input frame 55 through the input unit 23.

An outer shape dimension, the number of leads, a lead pitch, a lead length, a lead width, a component height, a component type, a shape type, and the like, which are size data 43, are input to "component shape" input frame 56 through input unit 23. "Component shape" input frame 56 is scrolled upward or downward with scroll bar 56a. If "enter" button 57 is operated, then the component name and the shape information (size data 43) of the component input to component shape input screen 54 are input. In this manner, input unit 23 receives an input of the shape information of the component.

In FIG. 2, first setting unit 12 sets operation parameters 47 corresponding to the shape information of the component and the application of the mounting board input through input unit 23 on the basis of rule table 19 or learning model 20 stored in production information storage unit 15. Rule table 19 correlates the shape information (size data 43) of the component, the application of the mounting board, operation parameters 47, and the like and allows operation parameters 47 corresponding to the shape information of the component and the application of the mounting board to be set from the operation parameter sets in operation parameter library 18.

Figure 5:
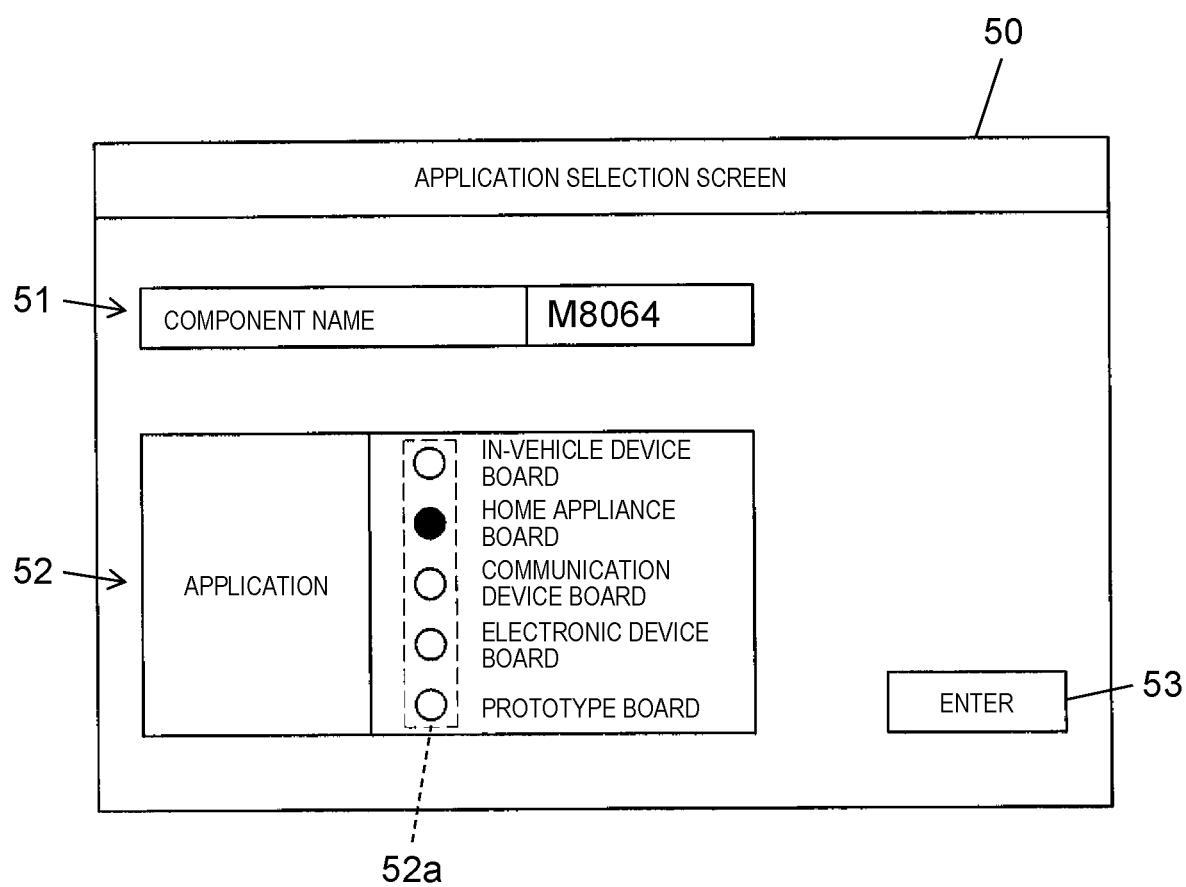
FIG. 5 is a diagram illustrating an example of an application selection screen in the management computer (production data creation device) according to the exemplary embodiment.
Figure 6:
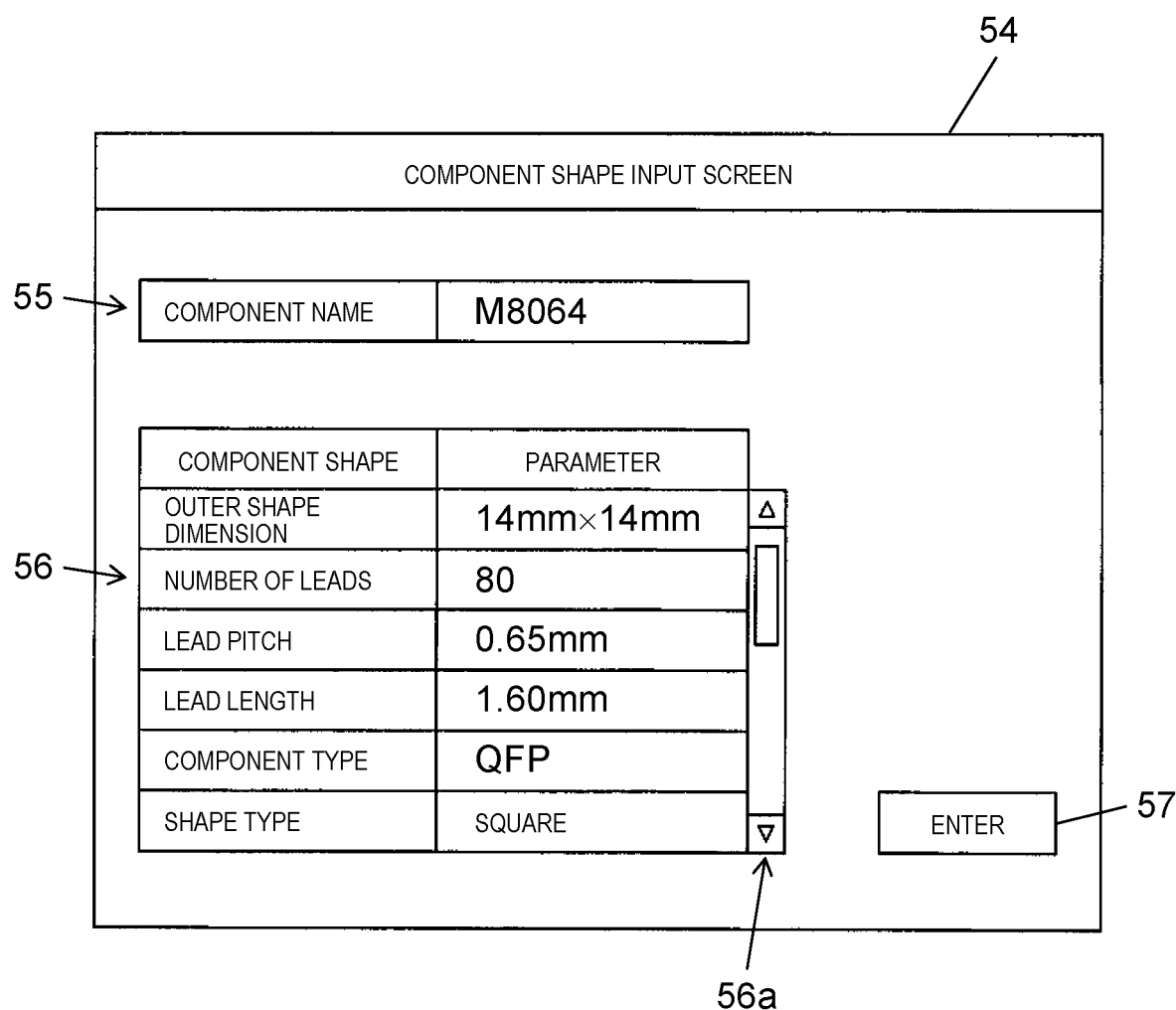
FIG. 6 is a diagram illustrating an example of a component shape input screen in the management computer (production data creation device) according to the exemplary embodiment.

In a case in which the application input in application selection screen 50 in FIG. 5 is a home appliance board, and component data 40 for the component with the component name "M8064" input on component shape input screen 54 in FIG. 6 is to be created, first setting unit 12 sets operation parameters 47 from the operation parameter sets for the home appliance board stored in operation parameter library 18 in accordance with rule table 19. In a case of a suction gap, which is one of operation parameters 47, for example, first setting unit 12 sets a parameter obtained through an arithmetic operation in accordance with a rule designated by rule table 19 for the suction gap in the operation parameter set for the home appliance board, using the component height that is the input component shape as a variable.

In FIG. 2, learning model 20 is a trained model that has been trained with the shape information (size data 43) of the component, the applications of the mounting board, operation parameters 47, and the like correlated with each other. Learning model 20 estimates operation parameters 47 from the operation parameter sets in operation parameter library 18 corresponding to the application of the mounting board, the shape information of the component, production history information 22, and the like.

In a case in which component data 40 for the component with the component name "M8064" is to be created, for example, first setting unit 12 causes such operation parameters 47 that provides a suction rate of higher than a predetermined value and a suction speed of higher than a predetermined value to be set using the operation parameter set for the home appliance board, the shape information of the component, and production history information 22 as variables, in accordance with learning model 20. In other words, first setting unit 12 sets operation parameters 47 corresponding to the shape information of the component input from learning model 20 and the application of the mounting board. Component data 40 created by first setting unit 12 is stored in component library 17.

More specifically, a part of values set by rule table 19 or learning model 20 for each application of "M8064" in component data 40 will be described. As speed parameter 47c in the recommended parameter set, the suction speed, the mounting speed, and the tape feeding speed are set to 100% which is the maximum speed. Also, a recognition speed is set to a high speed as recognition 47d. Next, operation parameters 47 set from the operation parameter set for the in-vehicle device board will be described. For an in-vehicle device board, production with higher precision (with a priority placed on quality) than that of the recommended parameter set is required. Therefore, the suction speed, the mounting speed, and the tape feeding speed are set to 60%. Also, the recognition speed is set to a medium speed as recognition 47d.

Next, operation parameters 47 set from the operation parameter set for the home appliance board will be described. For a home appliance board, production with priority placed on balanced quality and productivity is required. Therefore, the suction speed, the mounting speed, and the tape feeding speed are set to 80%. Also, the recognition speed is set to a medium speed as recognition 47d. Next, for a communication device board, production with higher productivity (with a priority placed on productivity) than that of the recommended parameter set is required. Therefore, the suction speed, the mounting speed, and the tape feeding speed are set to 90%. Also, a recognition speed is set to a high speed as recognition 47d.

Next, for an electronic device board, yet higher productivity (a high priority is placed on productivity) than that of operation parameters 47 set from the operation parameter set for the communication device board is required. Therefore, the suction speed, the mounting speed, and the tape feeding speed are set to 100%. Also, a recognition speed is set to a high speed as recognition 47d. Next, for a prototype board, a priority is placed on creation of the board, placement of a priority on quality as compared with that for the in-vehicle device board is required (high priority is placed on quality). Therefore, the suction speed, the mounting speed, and the tape feeding speed are set to 40%. Also, the recognition speed is set to a low speed as recognition 47d. The aforementioned operation parameters are examples for "M8064", and different values are set from the operation parameter sets, rule table 19, or learning model 20 depending on the components.

Also, rule table 19 and learning model 20 may include information regarding weighting on each parameter in the recommended parameter sets included in operation parameter library 18 for each application of the mounting board, instead of the information that associates the input applications of the mounting board and the operation parameter sets corresponding to the applications of the mounting board included in operation parameter library 18. In that case, first setting unit 12 executes the aforementioned processing and sets operation parameters 47 using the operation parameter sets corresponding to the application of the mounting board on the basis of the information of weighting and the recommended parameter set corresponding to the input application of the mounting board.

In this manner, management computer 3 is a production data creation device including input unit 23 that receives an input of one application from among the plurality of applications displayed as options on the screen (application selection screen 50) and first setting unit 12 that sets operation parameters 47 used by component mounters M4 and M5 to mount the component on the board, on the basis of the input application. It is thus possible to easily set optimal operation parameters 47 in accordance with the application of the board.

Figure 7:
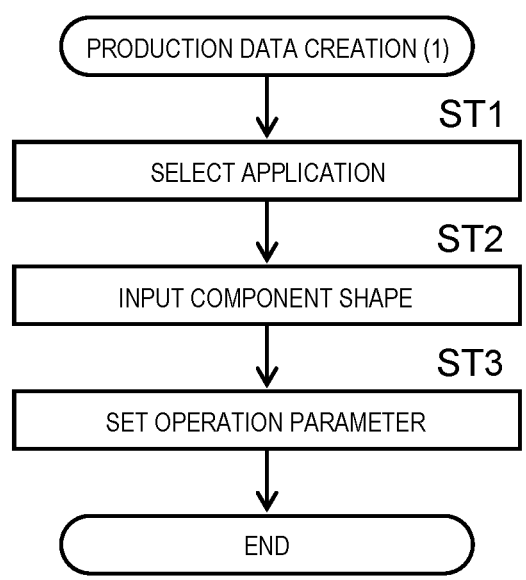
FIG. 7 is a flowchart illustrating a first production data creation method according to the exemplary embodiment.

Next, a first production data creation method in management computer 3 (production data creation device) will be described along the flow in FIG. 7. First, an input of one application from among a plurality of applications displayed as options on the screen (application selection screen 50) is input using input unit 23 (ST1: application selection process). Next, an input of shape information of the component is received from the screen display (component shape input screen 54) using input unit 23 (ST2: component shape input process).

Then, first setting unit 12 sets operation parameters 47 corresponding to the input shape information of the component and the input application from rule table 19 in which the shape information of the component, the applications of the mounting board, and operation parameters 47 are correlated with each other (ST3: first operation parameter setting process). Alternatively, first setting unit 12 sets operation parameters 47 corresponding to the input shape information of the component and the input application from learning model 20 in which the shape information of the component, the applications of the mounting board, and operation parameters 47 are correlated with each other.

Next, a second example of the present exemplary embodiment will be described. The second example is different from the aforementioned example, in which operation parameters 47 are set on the basis of the selected application of the mounting board, in that operation parameters 47 are set on the basis of an input target properties (input parameters). Hereinafter, the same reference signs will be applied to the same configurations as those in the aforementioned example, and detailed description thereof will be omitted. First, referring to FIG. 8, input parameter input screen 58 that input processing unit 11 causes display unit 24 to display will be described. On input parameter input screen 58, "production model name" input frame 59, "input parameter" input frame 60, and "enter" button 61 are displayed. The component name ("M8064") is input to "component name" input frame 59 through input unit 23.

Slider 60a to input a ratio between "quality" and "productivity" that are input parameters is displayed in "input parameter" input frame 60, and the input parameters are input through an operation of slider 60a in input unit 23. Here, the position indicating "quality" of 75% and "productivity" of 25% is designated by slider 60a. If "enter" button 61 is operated, then the production model name and the value of the input parameters input to input parameter input screen 58 are input. In this manner, input unit 23 receives at least inputs of the input parameters based on quality and productivity.

The input parameters are not limited to the quality and the productivity and may be, for example, mounting precision and a cost. Also, the number of input parameters is not limited to two and may be one, three, or more. The value of the input parameters is not limited to the ratio of two parameters and may be an absolute value of each parameter.

In FIG. 2, second setting unit 13 sets operation parameters 47 on the basis of the input parameters input through input unit 23 on the basis of rule table 19 or learning model 20 stored in production information storage unit 15. Rule table 19 correlates the shape information (size data 43) of the component, the input parameters, operation parameters 47, and the like and designates a rule for estimating operation parameters 47 corresponding to the shape information of the component and the input parameters from the recommended parameter sets in operation parameter library 18.

Figure 8:
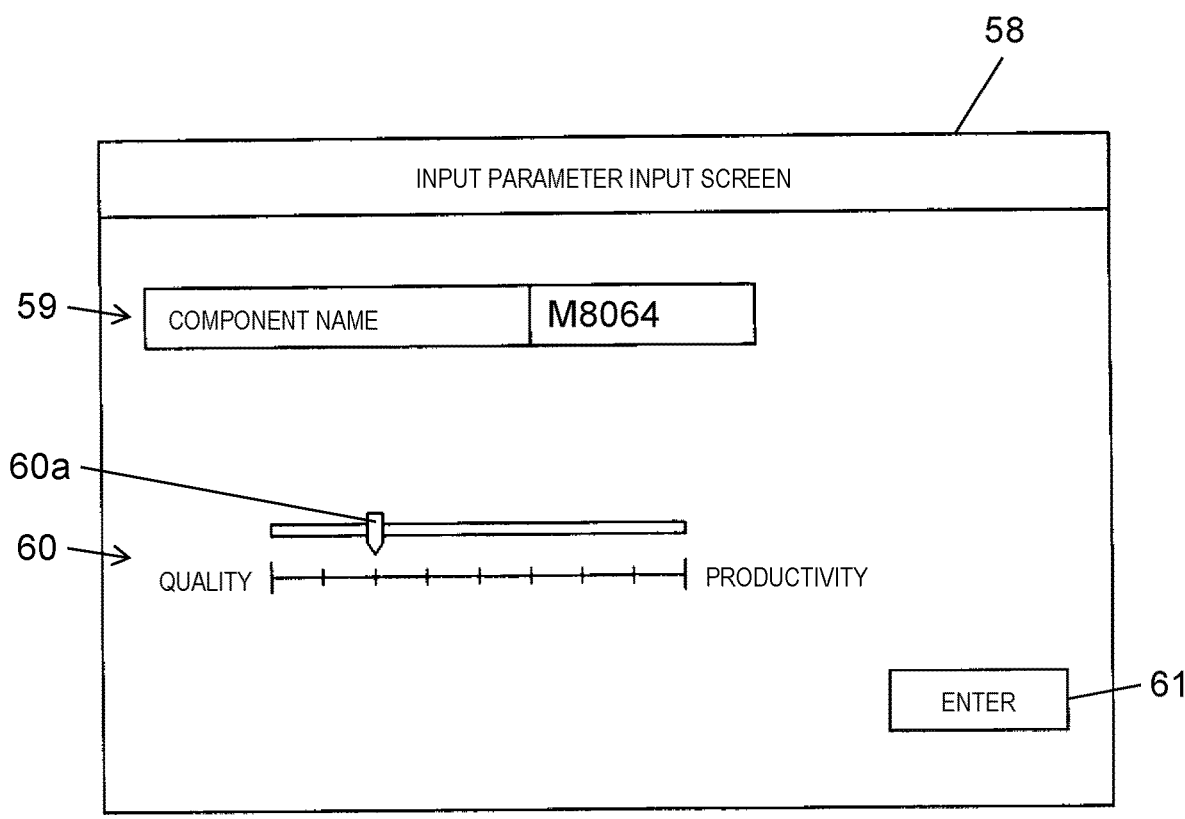
FIG. 8 is a diagram illustrating an example of an input parameter input screen in the management computer (production data creation device) according to the exemplary embodiment.

In a case in which component data 40 for the component with the component name "M8064" with the input parameters (quality 75%, productivity 25%) input to input parameter input screen 58 in FIG. 8 is to be created, second setting unit 13 specifies operation parameters 47 from the recommended parameter set stored in operation parameter library 18 in accordance with rule table 19 based on quality and rule table 19 based on productivity and sets operation parameters 47 weighted (weighted average) in accordance with the input parameters.

In a case of a mounting speed which is one of operation parameters 47, for example, second setting unit 13 sets a parameter obtained through an arithmetic operation using an input parameter that has been input as a variable and in accordance with a weighting rule designated in rule table 19 for the mounting speed of the recommended parameter set. In this case, since a higher priority is placed on quality than on productivity for the production model, the mounting speed is set to a lower value than that in the recommended parameter set.

Learning model 20 is a model that correlates the shape information (size data 43) of the component, the input parameters, operation parameters 47, and the like and estimates operation parameters 47 from the recommended parameter sets in operation parameter library 18 corresponding to the application of the mounting board, the shape information of the component, the input parameters, and production history information 22.

In a case in which component data 40 of the component with the component name "M8064" is to be created, for example, second setting unit 12 sets such operation parameters 47 that provides a mounting load of smaller than a predetermined value and a defect rate of lower than a predetermined value using the recommended parameter set, the shape information of the component, the input parameters, and production history information 22 as variables in accordance with learning model 20. In other words, second setting unit 13 sets operation parameters 47 corresponding to the input shape information of the component and the input parameters from learning model 20. Component data 40 created by second setting unit 13 is stored in component library 17.

In this manner, management computer 3 according to the second example is a production data creation device including input unit 23 that receives at least inputs of input parameters based on quality and productivity from screen display (input parameter input screen 58) and second setting unit 13 that sets operation parameters 47 used by component mounters M4 and M5 to mount the component on the board on the basis of the input parameters that have been input. It is thus possible to easily set optimal operation parameters 47 in accordance with target properties of the board.

Figure 9:
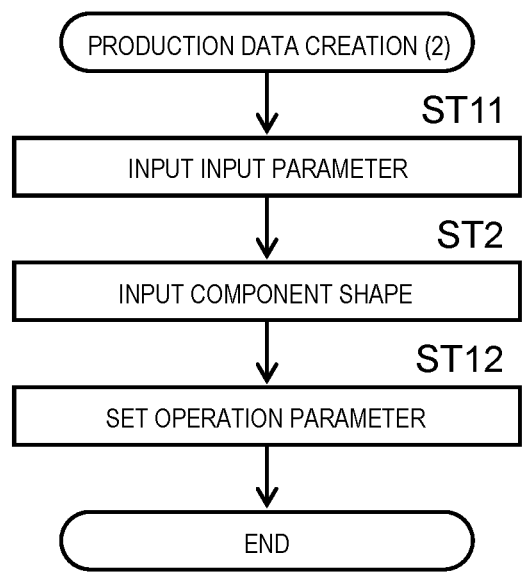
FIG. 9 is a flowchart illustrating a second production data creation method according to the exemplary embodiment.

Next, a second production data creation method in management computer 3 (production data creation device) according to a second example will be described along the flow in FIG. 9. Hereinafter, the same reference signs will be applied to the same processes in the first production data creation method, and detailed description thereof will be omitted. First, at least inputs of input parameters based on quality and productivity are received through screen display (input parameter input screen 58) using input unit 23 (ST11: input parameter input process). Then, the component shape input process (ST2) is executed.

Then, second setting unit 13 sets operation parameters 47 corresponding to the input shape information of the component and the input parameters that have been input from rule table 19 in which the shape information of the component, the input parameters, and operation parameters 47 are correlated with each other (ST12: second operation parameter setting process). Alternatively, second setting unit 12 sets operation parameters 47 corresponding to the input shape information of the component and the input parameters that have been input from learning model 20 in which the shape information of the component, the input parameters, and operation parameters 47 are correlated with each other.

The present invention has been described above on the basis of the present exemplary embodiment. Those skilled in the art will understand that modification examples of the exemplary embodiment and the example are also within the scope of the present invention. Examples of machine learning include "supervised learning" for learning a relationship between an input and an output using teacher data in which input information is labeled (output information), "non-supervised learning" of constructing a data structure only from a non-labeled input, "semi-supervised learning" handling both labeled and non-labeled inputs, and "enhanced learning" of learning an action from which the largest amount of feedback can be obtained through acquisition of feedback in response to an action selected from a result of observing a state.

Also, as specific methods for the machine learning, a neural network (including deep learning using multilayered neural networks), genetic programming, decision trees, a Bayesian network, a support vector machine (SVM), and the like are present. The learning unit applies more optimal feature information generated through the machine learning to various setting values of operation parameters 47 stored in learning model 20. In other words, the feature information indicates various setting values of operation parameters 47. Also, various setting values of operation parameters 47 used as labels for production are used in the aforementioned exemplary embodiment.

Also, although operation parameters 47 are set from the selected one application in the aforementioned exemplary embodiment, operation parameters 47 may be set from a plurality of applications. In a case in which operation parameters 47 are set from a plurality of applications, operation parameters 47 are calculated for each of the applications, and an average (weighted average) value is calculated with different weights for the selected applications and non-selected applications from among plurality of calculated operation parameters 47. Through such calculation, it is possible to easily set optimal operation parameters 47 for the application of the board that cannot be easily distinguished as well as the aforementioned applications of the board.

The various setting values of operation parameters 47 may be options other than the numerical values. In the case of options, reward is applied to operation parameter 47 of an option set without correction while no reward is applied to an operation parameter of a corrected option. The learning model is updated through updating of values (estimation rates) of the options in accordance with the reward. Examples of the options include a two-dimensional mode and a three-dimensional mode which are camera types of operation parameters 47.

According to the present disclosure, it is possible to easily set optimal operation parameters in accordance with an application of a board.

INDUSTRIAL APPLICABILITY

The production data creation device and the production data creation method according to the present disclosure have an advantage that optimal operation parameters can be easily set in accordance with applications of a board and are useful in the field of mounting a component on the board.

REFERENCE MARKS IN THE DRAWINGS

1 Component mounting system
2 Communication network
3 Management computer
4 Component mounting line
10 Processing unit
11 Input processing unit
12 First setting unit
13 Second setting unit
14 Achievement acquisition unit
15 Production information storage unit
16 Production data library
17 Component library
18 Operation parameter library
19 Rule table
20 Learning model
21 Production history storage unit
22 Production history information
23 Input unit
24 Display unit
25 Communication unit
30 Production data
35 Facility condition data
40 Component data
42 Shape diagram
43 Size data
44 Component Parameter
45 Component information
46 Tape information
47 Operation parameter
47*a* Model
47*b* Nozzle setting
47*c* Speed parameter
47*d* Recognition
47*e* Gap
47*f* Suction
50 Application selection screen
51 Input frame
52 Selection frame
52*a* Radio button
53 Button 54 Component shape input screen
55 Input frame
56 Input frame
56a Scroll bar
57 Button
58 Input parameter input screen
59 Input frame
60 Input frame
60a Slider
61 Button
75 Quality
M1 Board supply device
M2 Board passing device
M3 Solder printing device
M4, M5 Component mounter
M6 Reflow device
M7 Board collection device

The invention claimed is:

1. A production data creation device comprising:
an input interface configured to receive an input of one application from among a plurality of applications displayed on a screen; and
a processor configured to:
determine a priority weight between quality and productivity for the inputted application, and
set one or more operation parameters including a recognition parameter for recognizing a shape of a component, the one or more operation parameters to be used by a component mounter to mount the component on a board, on the basis of the inputted application and the priority weight.

2. The production data creation device of claim 1,
wherein the plurality of applications include at least two of an in-vehicle device board, a home appliance board, a communication device board, an electronic device board, and a prototype board.

3. The production data creation device of claim 1,
wherein the one or more operation parameters include at least one of a nozzle parameter regarding a nozzle that sucks the component, a suction parameter regarding suction for the nozzle to perform the suction, and a mounting parameter for mounting the component.

4. The production data creation device of claim 1,
wherein the input interface is further configured to receive an input of shape information of the component, and
the processor is configured to set an operation parameter corresponding to shape information of the component and the inputted application from a rule table in which at least the shape information of the component, the applications, and the one or more operation parameters are correlated with each other.

5. The production data creation device of claim 1,
wherein the input interface is further configured to receive an input of shape information of the component, and
the processor is configured to set one or more operation parameters corresponding to shape information of the component and the inputted application from a learning model in which at least the shape information of the component, the applications, and the one or more operation parameters are correlated with each other.

6. A production data creation method comprising:
receiving an input of one application from among a plurality of applications displayed on a screen;
determining, by a processor, a priority weight between quality and productivity for the inputted application; and
setting, by the processor, one or more operation parameters including a recognition parameter for recognizing a shape of a component, the one or more operation parameters used by a component mounter to mount the component on a board, on the basis of the inputted application and the priority weight.

7. The production data creation method of claim 6,
wherein the plurality of applications include at least two of an in-vehicle device board, a home appliance board, a communication device board, an electronic device board, and a prototype board.

8. The production data creation method of claim 6,
wherein the one or more operation parameters include at least one of a nozzle parameter regarding a nozzle that sucks the component, a suction parameter regarding suction for the nozzle to perform the suction, and a mounting parameter for mounting the component.

9. The production data creation method of claim 6, further comprising:
further receiving an input of shape information of the component; and
setting one or more operation parameters corresponding to shape information of the component and the inputted application from a rule table in which at least the shape information of the component, the applications, and the one or more operation parameters are correlated with each other.

10. The production data creation method of claim 6, further comprising:
further receiving an input of shape information of the component; and
setting one or more operation parameters corresponding to the shape information of the component and the inputted application from a learning model in which at least the shape information of the component, the applications, and the one or more operation parameters are correlated with each other.

11. A production data creation device comprising:
an input interface configured to:
receive an input of one application from among a plurality of applications displayed on a screen, and
receive at least inputs of one or more input parameters based on quality and productivity; and
a processor configured to:
determine a priority weight between quality and productivity for the inputted application, and
set one or more operation parameters including a recognition parameter for recognizing a shape of a component, the one or more operation parameters used by a component mounter to mount a component on a board, on the basis of the one or more inputted parameters that have been inputted and the priority weight.

12. The production data creation device of claim 11,
wherein the one or more operation parameters include at least one of a nozzle parameter regarding a nozzle that sucks the component, a suction parameter regarding suction for the nozzle to perform the suction, and a mounting parameter for mounting the component.

13. The production data creation device of claim 11,
wherein the input interface is further configured to receive an input of shape information of the component, and
the processor is configured to set one or more operation parameters corresponding to input shape information of the component and the one or more input parameters that have been input, from a rule table in which at least the shape information of the component, the one or more input parameters, and the one or more operation parameters are correlated with each other.

14. The production data creation device of claim 11, wherein the input interface is further configured to receive an input of shape information of the component, and the processor is configured to set one or more operation parameters corresponding to the shape information of the component and the one or more input parameters that have been input, from a learning model in which at least the shape information of the component, the one or more input parameters, and the one or more operation parameters are correlated with each other.

15. A production data creation method comprising:

receiving an input of one application from among a plurality of applications displayed on a screen;

receiving at least inputs of one or more input parameters based on quality and productivity;

determining a priority weight between quality and productivity for the inputted application; and setting one or more operation parameters including a recognition parameter for recognizing a shape of a component, the one or more operation parameters to be used by a component mounter to mount the component on a board, on the basis of the one or more input parameters that have been inputted and the priority weight.

16. The production data creation method of claim 15, wherein the one or more operation parameters include at least one of a nozzle parameter regarding a nozzle that sucks the component, a suction parameter regarding suction for the nozzle to perform the suction, and a mounting parameter for mounting the component.

17. The production data creation method of claim 15, further comprising:

further receiving an input of shape information of the component; and setting one or more operation parameters corresponding to the inputted shape information of the component and the one or more input parameters that have been input, from a rule table in which at least the shape information of the component, the one or more input parameters, and the one or more operation parameters are correlated with each other.

18. The production data creation method of claim 15, further comprising:

further receiving an input of shape information of the component; and setting one or more operation parameters corresponding to the shape information of the component and the one or more input parameters that have been inputted, from a learning model in which at least the shape information of the component, the one or more input parameters, and the one or more operation parameters are correlated with each other.

* * * * *